(12) United States Patent
Kim et al.

(10) Patent No.: US 12,610,815 B2
(45) Date of Patent: Apr. 21, 2026

(54) BOND WIRE RELIABILITY AND PROCESS WITH HIGH THERMAL PERFORMANCE IN SMALL OUTLINE PACKAGE

(71) Applicant: Texas Instruments Incorporated, Dallas, TX (US)

(72) Inventors: Kwang-Soo Kim, Sunnyvale, CA (US); Vivek Arora, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 559 days.

(21) Appl. No.: 17/992,990

(22) Filed: Nov. 23, 2022

(65) Prior Publication Data

US 2024/0170359 A1     May 23, 2024

(51) Int. Cl.
| | |
|---|---|
| *H01L 23/367* | (2006.01) |
| *H01L 21/48* | (2006.01) |
| *H01L 23/00* | (2006.01) |
| *H01L 23/31* | (2006.01) |
| *H01L 23/495* | (2006.01) |

(52) U.S. Cl.
CPC ...... *H01L 23/3672* (2013.01); *H01L 21/4875* (2013.01); *H01L 23/3121* (2013.01); *H01L 23/49568* (2013.01); *H01L 24/48* (2013.01); *H01L 24/85* (2013.01); *H01L 2224/48175* (2013.01); *H01L 2224/85007* (2013.01)

(58) Field of Classification Search
CPC ............. H01L 23/3672; H01L 23/3121; H01L 23/49568; H01L 21/4875; H01L 24/48; H01L 24/85; H01L 2224/48175; H01L 2224/85007
See application file for complete search history.

(56) References Cited

U.S. PATENT DOCUMENTS

| | | | | |
|---|---|---|---|---|
| 5,444,025 A | * | 8/1995 | Sono ..................... | H01L 21/565 257/796 |
| 5,686,361 A | * | 11/1997 | Ootsuki .............. | H01L 23/4334 257/E23.092 |
| 6,424,031 B1 | * | 7/2002 | Glenn ................... | H01L 25/105 257/676 |
| 6,713,864 B1 | * | 3/2004 | Huang ................... | H01L 24/32 257/E23.092 |

OTHER PUBLICATIONS

DRV8312, DRV8332 Product Data Sheet SLES256F, Texas Instruments, May 2010, Revised May 2022.
TAS5142 Product Data Sheet SLES126B, Texas Instruments, May 2005.

* cited by examiner

*Primary Examiner* — Norman D Richards
*Assistant Examiner* — Sammantha K Salaz
(74) *Attorney, Agent, or Firm* — Ronald O. Neerings; Frank D. Cimino

(57) ABSTRACT

An electronic device includes a package structure, a lead, a heat slug, a semiconductor die, and a bond wire. The package structure has opposite first and second sides, and opposite third and fourth sides spaced along a first direction. The heat slug has a first portion partially exposed outside the second side of the package structure, and a second portion with slots extending inwardly along the first direction and fins between respective pairs of the slots, where the fins are enclosed by the package structure and spaced along an orthogonal second direction. The semiconductor die is attached to the heat slug, and the bond wire has a first end connected to the lead and a second end connected to a circuit of the semiconductor die.

22 Claims, 15 Drawing Sheets

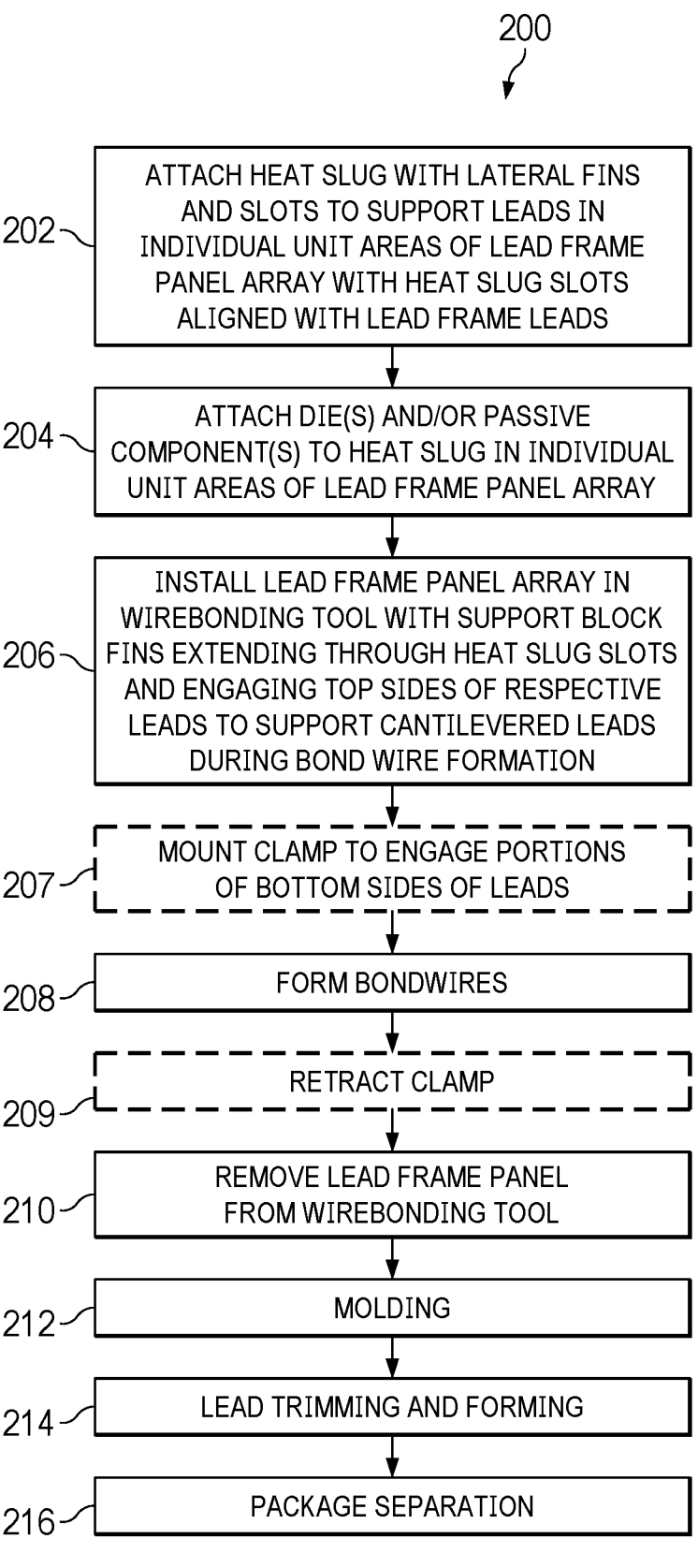

200

202 — ATTACH HEAT SLUG WITH LATERAL FINS AND SLOTS TO SUPPORT LEADS IN INDIVIDUAL UNIT AREAS OF LEAD FRAME PANEL ARRAY WITH HEAT SLUG SLOTS ALIGNED WITH LEAD FRAME LEADS

204 — ATTACH DIE(S) AND/OR PASSIVE COMPONENT(S) TO HEAT SLUG IN INDIVIDUAL UNIT AREAS OF LEAD FRAME PANEL ARRAY

206 — INSTALL LEAD FRAME PANEL ARRAY IN WIREBONDING TOOL WITH SUPPORT BLOCK FINS EXTENDING THROUGH HEAT SLUG SLOTS AND ENGAGING TOP SIDES OF RESPECTIVE LEADS TO SUPPORT CANTILEVERED LEADS DURING BOND WIRE FORMATION

207 — MOUNT CLAMP TO ENGAGE PORTIONS OF BOTTOM SIDES OF LEADS

208 — FORM BONDWIRES

209 — RETRACT CLAMP

210 — REMOVE LEAD FRAME PANEL FROM WIREBONDING TOOL

212 — MOLDING

214 — LEAD TRIMMING AND FORMING

216 — PACKAGE SEPARATION

FIG. 2

BOND WIRE RELIABILITY AND PROCESS WITH HIGH THERMAL PERFORMANCE IN SMALL OUTLINE PACKAGE

BACKGROUND

High power electronic devices are used in a variety of applications, including power supplies, motor drives, etc. Switching devices, such as transistors in these applications can operate at high voltages and may conduct large currents. Gallium nitride (GaN) and other high electron mobility transistors (HEMT) provide high current carrying capability with low on state resistance and are becoming popular in these applications. Efficiency and high power density are continuing goals in the design of high power systems and electronic devices for such systems. Heat dissipation capabilities are limited in traditional package types, such as quad flat no lead (QFN) devices. Small outline packages (SOP), such as power small outline packages (PSOP) may include a copper heat slug in a plastic body to help dissipate heat and improve the power density compared with standard small outline integrated circuit (SOIC) package types. However, PSOPs create manufacturing hurdles, including the heat slug restricting or obstructing access to floating or cantilevered leads during wirebonding, which can lead to wirebonding failures, and reducing the size of the heat slug will reduce the heat dissipation capabilities.

SUMMARY

In one aspect, an electronic device includes a package structure, a lead, a heat slug, a semiconductor die, and a bond wire. The package structure has opposite first and second sides, and opposite third and fourth sides spaced along a first direction. The heat slug has a first portion partially exposed outside the second side of the package structure, and a second portion with slots extending inwardly along the first direction and fins between respective pairs of the slots, where the fins are enclosed by the package structure and spaced along an orthogonal second direction. The semiconductor die is attached to the heat slug, and the bond wire has a first end connected to the lead and a second end connected to a circuit of the semiconductor die.

In another aspect, a method of fabricating an electronic device includes attaching a heat slug with lateral fins and slots to a lead frame panel array with the slots aligned with leads of the lead frame panel array, attaching a semiconductor die to the heat slug, supporting the lead frame panel array in a support block with support block fins extending through the slots of the heat slug and engaging bottom sides of the leads of the lead frame panel array, and forming a bond wire to couple a first portion of one of the leads with a circuit of the semiconductor die.

In a further aspect, a heat slug includes a first portion having a planar side in a plane of orthogonal first and second directions, and a second portion extending from the first portion along a third direction away from the side of the first portion. The second portion has slots extending inwardly along the first direction and fins between respective pairs of the slots, and the fins spaced apart from one another along the second direction.

BRIEF DESCRIPTION OF THE DRAWINGS

FIG. 2 is a flow diagram of a method of fabricating an electronic device.

DETAILED DESCRIPTION

Figure 1:
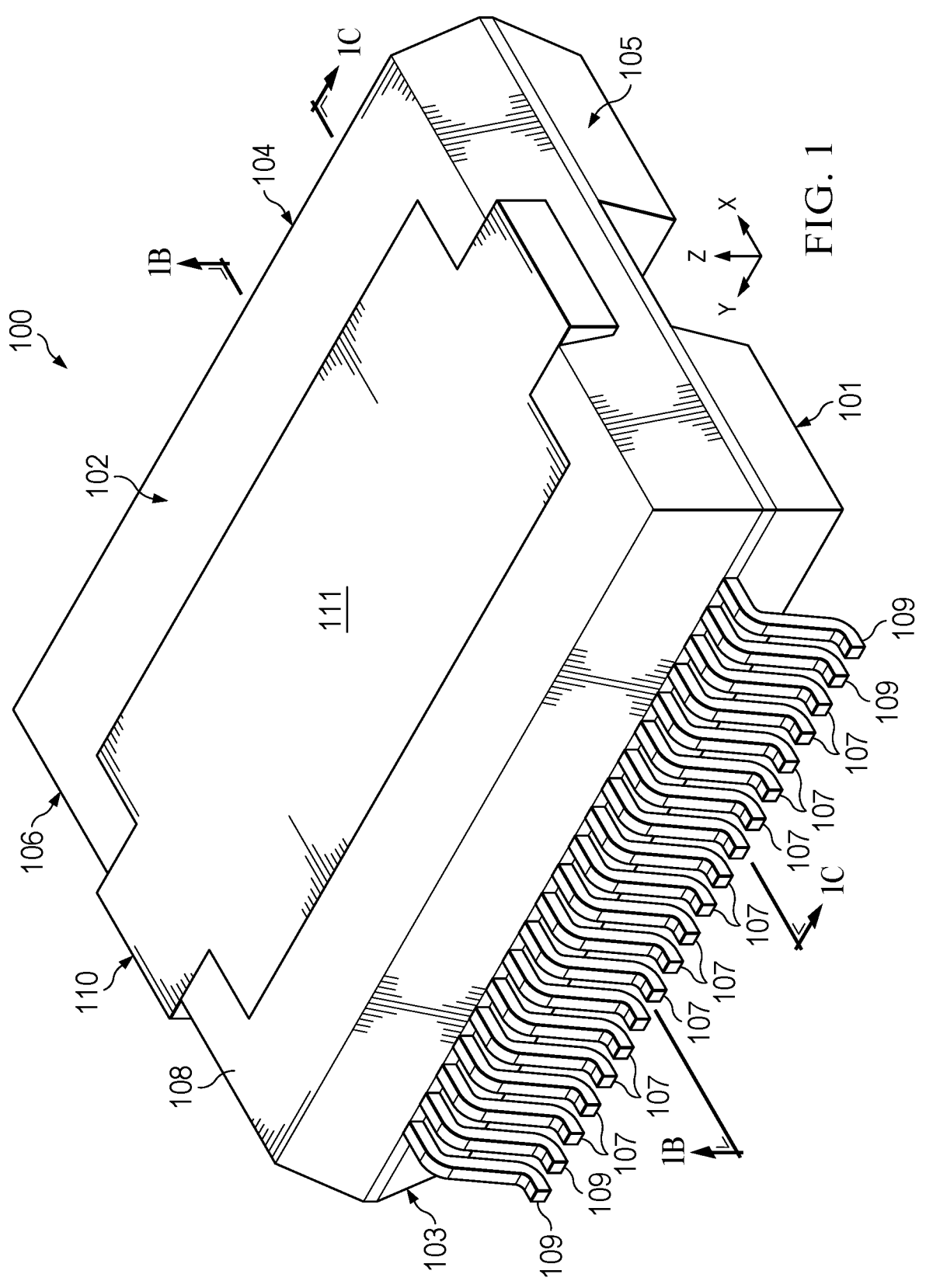
FIG. 1 is a top perspective view of an electronic device having a heat slug with an exposed top side and internal lateral fins and slots.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating. Unless otherwise stated, "about," "approximately," or "substantially" preceding a value means +/−10 percent of the stated value.

Figure 1A:
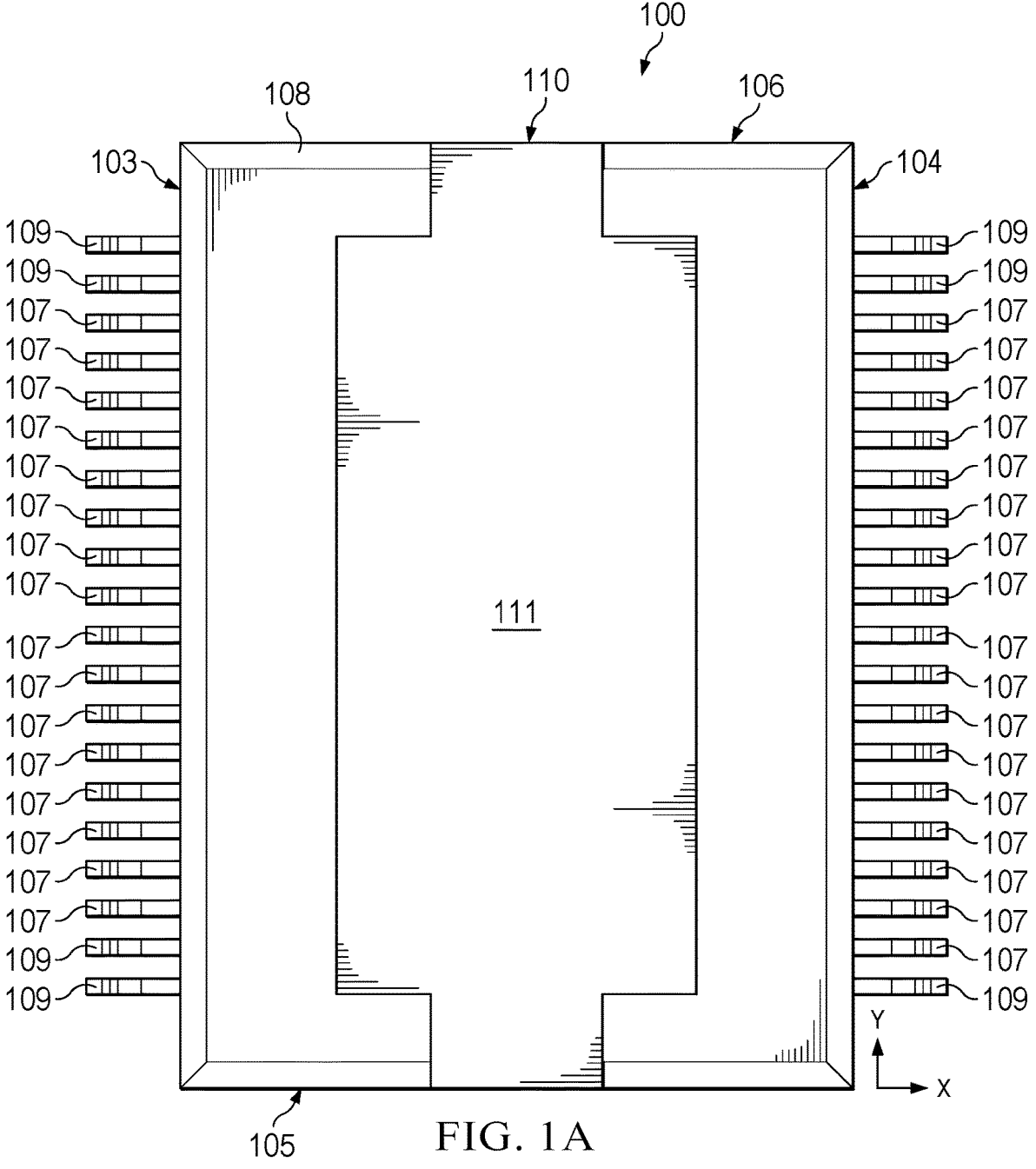
FIG. 1A is a top plan view of the electronic device of FIG. 1.
Figures 1B, 1C:
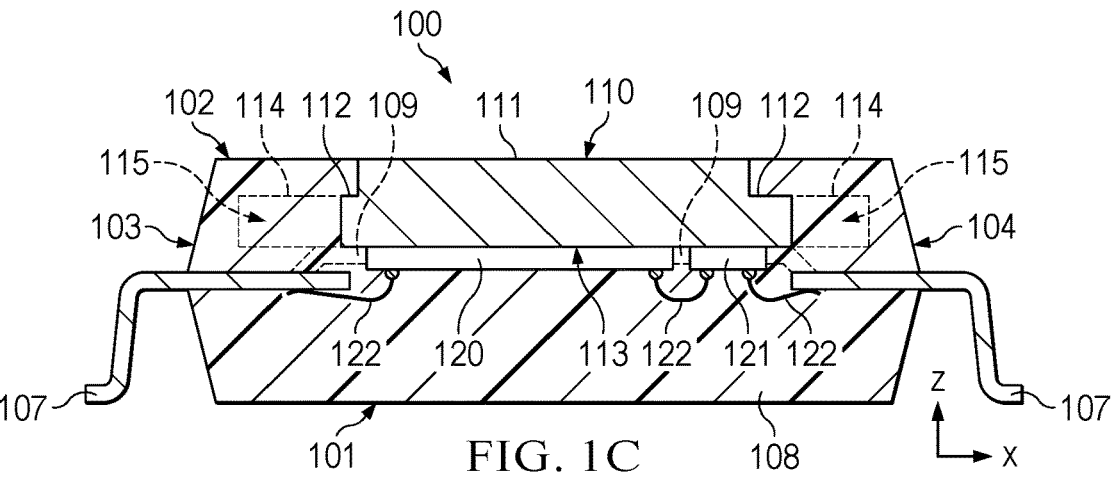
FIG. 1B is a sectional bottom view of the electronic device taken along line 1B-1B of FIG. 1.
FIG. 1C is a partial sectional side elevation view of the electronic device taken along line 1C-1C of FIG. 1.
Figure 1D:
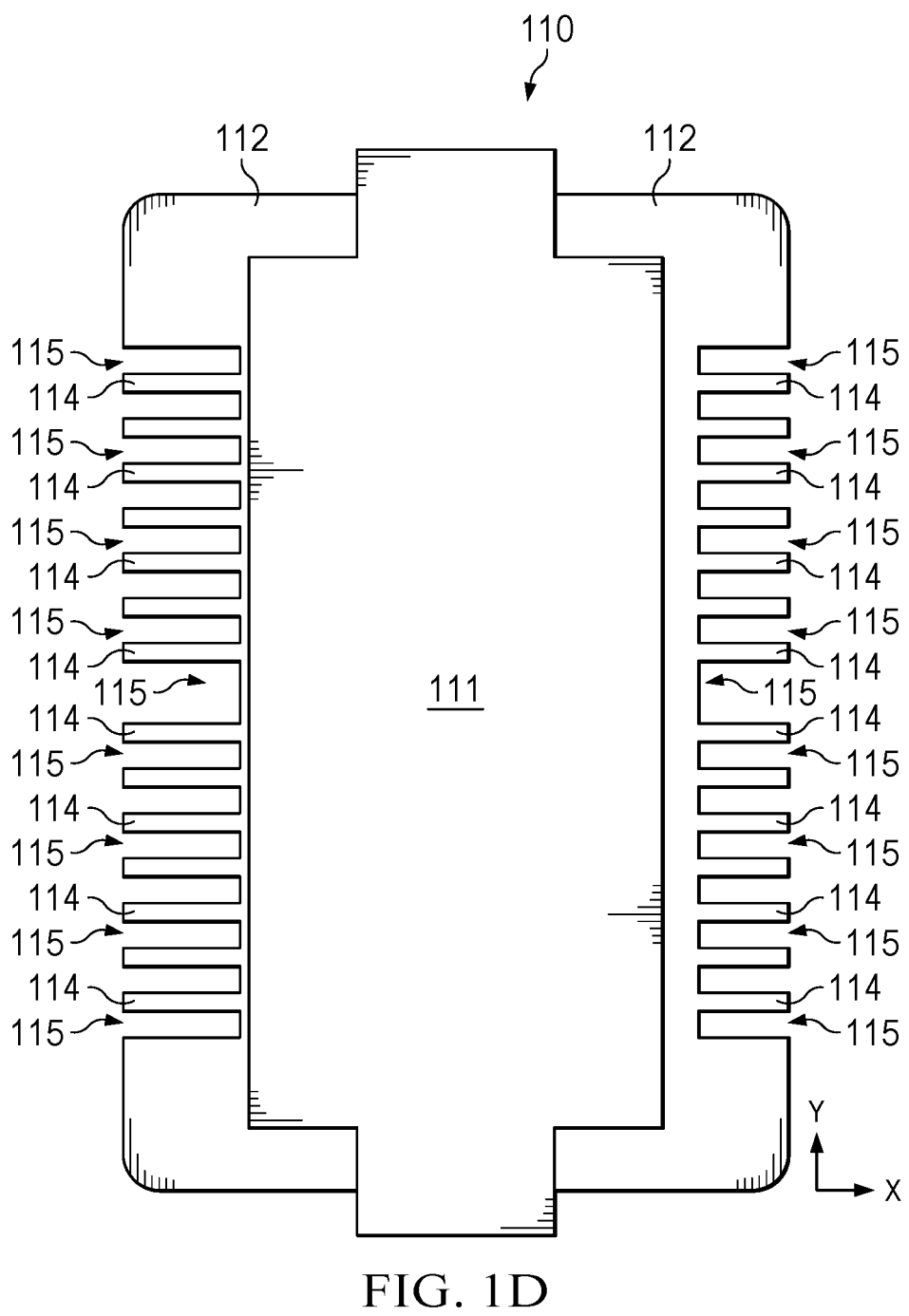
FIG. 1D is a top plan view of the heat slug of the electronic device with internal lateral fins and slots.
Figure 1E:
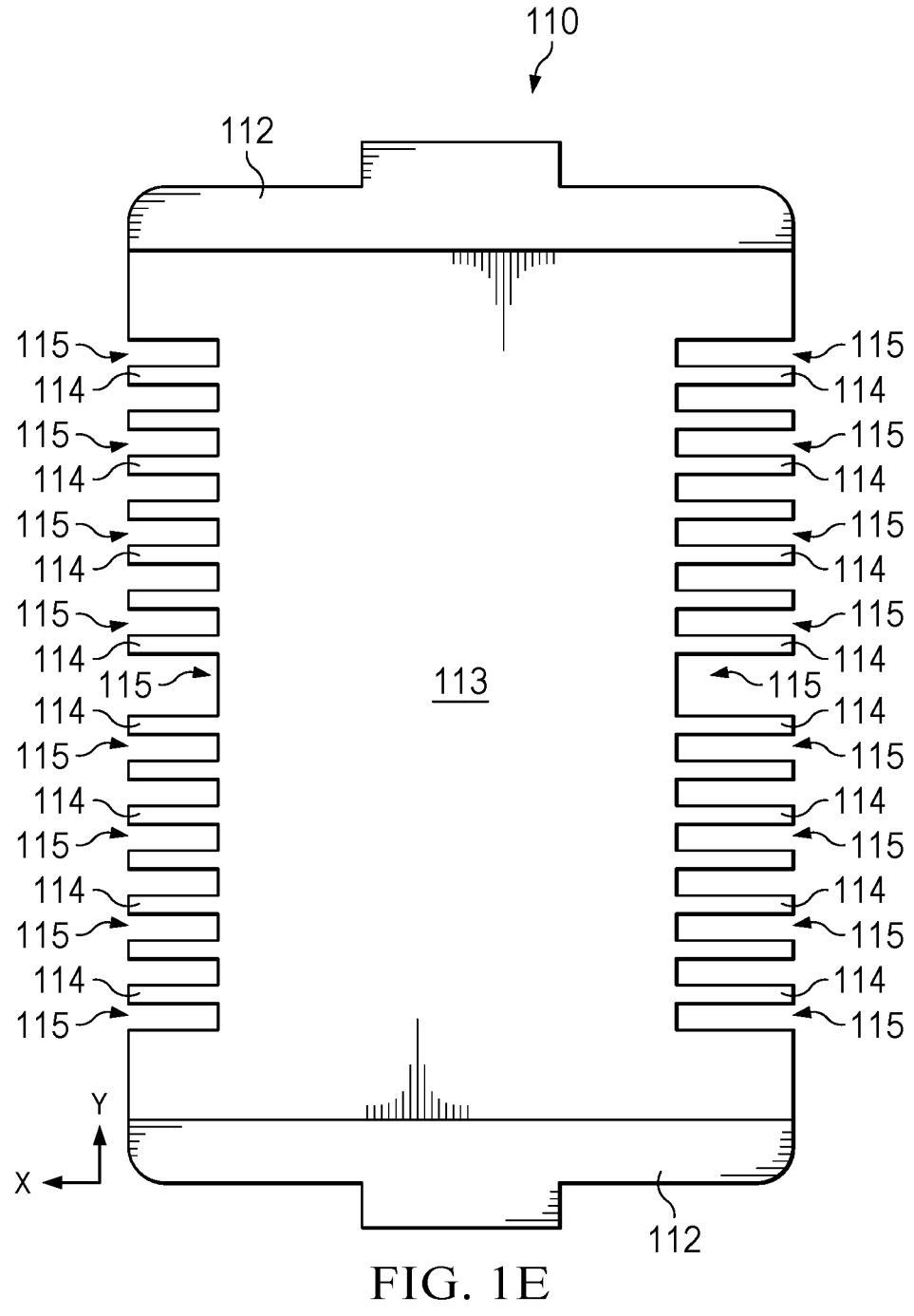
FIG. 1E is a bottom view of the heat slug of the electronic device.

FIGS. 1-1E show a PSOP electronic device 100 that provides a compact high power solution having an included heat slug 110 having lateral fins and slots. The heat slug 110 provides slotted access for structurally supporting lead frame leads during wirebonding to facilitate bond wire integrity. The heat slug fins and slots also increase the heat slug surface area to facilitate heat dissipation from high power electronic components such as die-based GaN or other transistors and/or passive components of the device 100. The described examples provide a solution for high power electronic devices that is adaptable to a variety of different circuit and system applications and to different package types for increased power density with improved device reliability.

FIGS. 1 and 1A show respective top perspective and plan views of the electronic device 100, FIG. 1B shows a sectional bottom view taken along line 1B-1B of FIG. 1 and FIG. 1C shows a sectional side view of the electronic device 100 taken along line 1C-1C of FIG. 1. FIGS. 1D and 1E show respective top and bottom views of the heat slug 110 of the electronic device 100. As shown in FIG. 1, the electronic device 100 has a generally rectangular shape with a molded plastic package structure 108 that includes opposite first and second (e.g., bottom and top) sides 101 and 102, respectively, and lateral third, fourth, fifth, and sixth sides 103, 104, 105, and 106, respectively. The electronic device 100 is shown in FIGS. 1-1C in an example position or orientation in a three-dimensional space with a first direction X, a perpendicular (orthogonal) second direction Y, and a third direction Z that is perpendicular (orthogonal) to the respective first and second directions X and Y, and structures or features along any two of these respective directions are orthogonal to one another.

In the illustrated orientation, the respective first and second sides 101 and 102 are spaced apart from one another along the third direction Z, the respective third and fourth sides 103 and 104 are spaced apart from one another along the first direction X, and the respective fifth and sixth sides 105 and 106 are spaced apart from one another along the second direction Y. In one example, the package structure 108 is a PSOP structure with rows of gullwing shaped conductive metal leads 107 that extend outward from the respective third and fourth sides 103 and 104 and downward along the third direction Z in the illustrated orientation. In other examples, different package and lead types and forms can be used. The individual leads 107 are spaced apart from the heat slug 110 and include a first portion inside the package structure 108 and a second portion exposed outside the package structure 108. The second portions of the leads 107 are configured to be soldered to a host printed circuit board (PCB, not shown) or to be installed in a corresponding socket (not shown) of a host PCB, for example, for electrical connection to a circuit of a semiconductor die 120 or 121 of the electronic device 100.

The example electronic device 100 also includes gullwing shaped conductive metal support leads 109 having a first portion connected to the heat slug 110 inside the package structure 108 and a second portion exposed outside the package structure 108. In the illustrated example, the support leads 109 are also configured to be soldered to a host PCB or installed in a corresponding socket. The support leads 109 may, but need not be, electrically coupled to the heat slug 110. In one example, the heat slug 110 is attached to the support leads 109 by rivets, welding, soldering or a conductive adhesive (not shown) to provide mechanical and electrical connection. In other examples, a non-conductive adhesive can be used to attach the heat slug 110 to the support leads 109.

In one example, the heat slug 110 is a thermally conductive structure that is or includes a metal material such as aluminum, copper, etc. The heat slug 110 has a partially exposed upper first portion 111 (FIGS. 1, 1A, 1C, and 1D) and a second portion 112 (FIGS. 1B-1E). The heat slug 110 is spaced apart from the leads 107. The first portion 111 has a planar upper or top side in a plane of the first and second directions X and Y, and the top side of the first portion 111 of the heat slug 110 is partially exposed outside the second side 102 of the package structure 108 as shown in FIGS. 1, 1A and 1C. In one example, the exposed side of the first portion 111 is substantially flush with the second side 102 of the package structure 108. In the illustrated example, the top side of the first portion 111 of the heat slug 110 extends slightly above the second side 102 of the package structure 108 as shown in FIGS. 1 and 1C. As shown in FIGS. 1 and 1A, the first portion 111 has a wide inner section and narrower ends extending to the respective fifth and sixth sides 105 and 106.

The second portion 112 of the heat slug 110 extends from the first portion 111 downward along the third direction Z away from the top side of the first portion 111. The second portion 112 has a bottom side with an indent 113 (FIGS. 1B, 1C, and 1E) as well as lateral fins 114 and slots 115 (FIGS. 1B-1E) on laterally opposite sides. As best shown in FIGS. 1B-1E, the slots 115 on both lateral sides extend inwardly in the second portion 112 of the heat slug 110 along the first direction X. The fins 114 extend outward along the first direction X between respective pairs of the slots 115. The slots 115 and the fins 114 extend along the third direction Z from the bottom to the top in the indented part of the second portion 112. The fins 114 and the slots 115 are enclosed by the package structure 108. The fins 114 along each lateral side are spaced apart from one another along the second direction Y.

The internal first portions of the leads 107 inside the package structure 108 are aligned with respective ones of the heat slug slots 115 along the third direction Z. A first set of the fins 114 are located between respective pairs of a first set of the slots 115 and have respective ends that face the third side 103 of the package structure 108 along the first direction X. In this example, each lead 107 of a first set of the leads 107 has a first portion and a second portion, where the first portion of each of the first set of leads 107 is inside the package structure 108 and aligned with a respective one of the first set of the slots 115 along the third direction Z. The second portion of each of the first set of leads 107 extends outward from the third side 103 of the package structure 108 along the first direction X.

In this example, a second set of the fins 114 are located between respective pairs of a second set of the slots 115 and have respective ends that face the fourth side 104 of the package structure 108 along the first direction X. Each of a second set of leads 107 has a first portion and a second portion. The first portion of each of the second set of leads 107 is inside the package structure 108 and aligned with a respective one of the second set of the slots 115 along the third direction Z. The second portion of each of the second set of leads 107 extends outward from the fourth side 104 of the package structure 108 along the first direction X.

In other examples, at least one fin, two or more slots, and one or more aligned leads are provided along any one or more of the lateral sides 103, 103, 105 and/or 106 and/or one or more of the leads have sides or surfaces exposed along the bottom or first side 101.

In various implementations, the electronic device 100 also includes one or more semiconductor dies and/or individual electronic components inside the package structure 108. The illustrated example includes respective first and second semiconductor dies 120 and 121 that are attached to the heat slug 110. In one example, the semiconductor dies 120 and 121 are attached to the heat slug 110 by solder (not shown).

In another example, the semiconductor dies 120 and 121 are attached to the heat slug 110 by an adhesive.

The electronic device 100 includes one or more bond wires 122 inside the package structure 108 to form electrical connections to a circuit of one or both of the semiconductor dies 120 and 121 and for electrical circuit connections to one or more of the leads 107. Some of the individual bond wires 122 have a first end connected to the first portion of a respective one of the leads 107 and a second end connected to a circuit of a respective one of the semiconductor dies 120 and 121. Other bond wires 122 in the illustrated example have respective ends connected to conductive features (e.g., bond pads) of the first and second semiconductor dies 120 and 121 to electrically interconnect circuits (e.g., single or multiple components) thereof.

During electronic device manufacturing, the slots 115 of the heat slug 110 are aligned with the overlying leads 107 of a starting lead frame and allow a wirebonding tool support structure to extend through the slots along the third direction Z to engage and mechanically support the lead frame leads during wirebonding, as illustrated and described further below in connection with FIGS. 2 and 5-9 to facilitate bond wire integrity in the finished electronic device 100. In operation, when the electronic device 100 is attached to a host PCB (e.g., soldered to or installed in a corresponding socket, not shown), the fins 114 and slots 115 of the heat slug 110 heat slug facilitate heat removal by increasing the heat slug surface area. Thus, while the removal of heat slug material in forming the slots 115 can decrease the overall volume of the heat slug structure 110, the increased surface area created by the sides of the slots 115 and the fins 114 facilitates heat dissipation from high power electronic components such as die-based GaN or other transistors and circuits of the semiconductor dies 120 and 121 and/or passive components (not shown) of the device 100. The connection of the support leads 109 to the heat slug 110 can provide a further path for heat removal from the heat slug 110 through the support leads 109 to corresponding thermally conductive metal pads and PCB traces.

Referring now to FIGS. 2-10A, FIG. 2 shows a method 200 of fabricating an electronic device and FIGS. 3-10A show the electronic device 100 undergoing fabrication processing according to the method 200 in one example unit area of a panel array with rows and columns of unit areas. The method 200 in one example uses a starting lead frame panel array having rows and columns of unit areas, as well as individual heat slugs (e.g., instances of the heat slug 110 shown in FIGS. 1D and 1E described above) for use in each unit area of the lead frame panel array.

Figure 3:
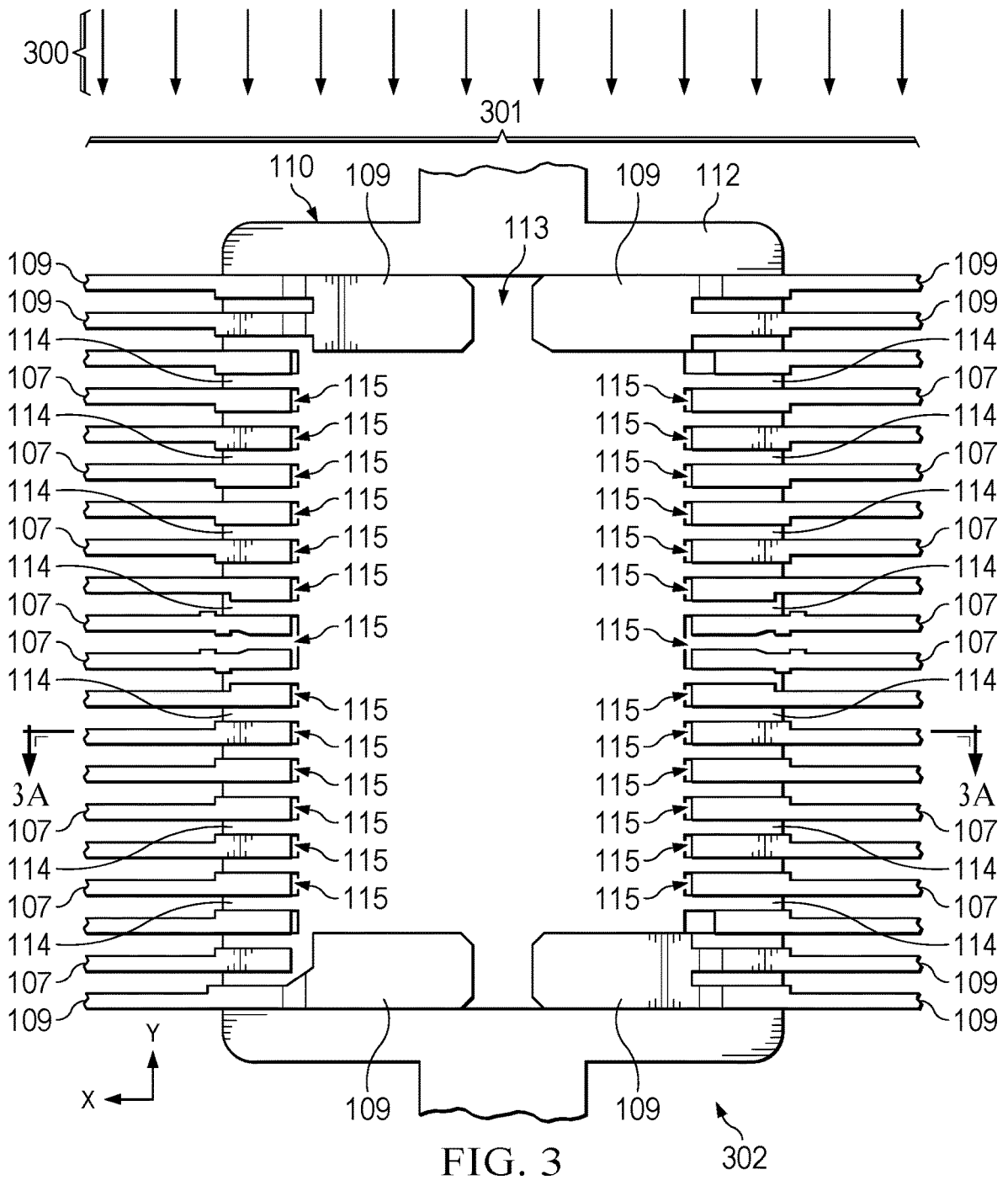
FIGS. 3 and 3A are partial bottom and sectional side elevation views of a heat slug with fins and slots being attached to supporting leads of a unit area of a lead frame panel array.
Figure 3A:
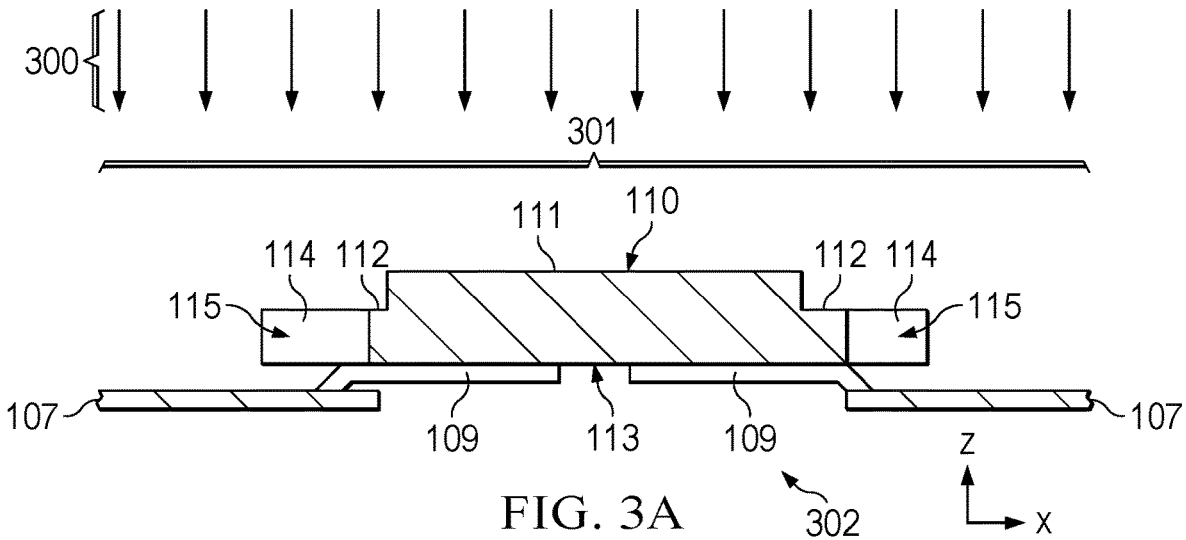

The method 200 includes heat slug attachment to the lead frame panel array at 202 in FIG. 2. FIGS. 3 and 3A show one example, in which an attachment process 300 is performed that attaches a heat slug 110 with lateral fins 114 and slots 115 to respective unit areas 301 of a lead frame panel array 302 with the slots 115 aligned with leads 107 of the lead frame panel array 302. As seen in the bottom view of FIG. 3, the fins 114 are positioned to be aligned with the slots 115 (e.g., gaps) between the respective first portions of the lead frame lead structures 107 along the vertical third direction Z.

The heat slugs 110 can be attached to any suitable portion of the lead frame panel array 302 in the respective unit areas 301. In the illustrated example, the individual heat slugs 110 are attached to the support leads 109 in each respective unit area 301, for example, using automated pick and place equipment (not shown) using any suitable attachment technique. The attachment process 300 in one example includes attaching the heat slug 110 to the support leads 109 by respective rivets (not shown) to form an electrical and mechanical connection. In another example, the attachment process 300 adheres the heat slug 110 to the support leads 109 using an adhesive (not shown) to form a mechanical connection, where electrically conductive, electrically insulating, and/or thermally conductive adhesives can be used in different implementations, with or without a separate thermal or UV curing step. In another example, the attachment process 300 includes soldering the heat slug 110 to the support leads 109 in each unit area 301 of the lead frame panel array 302.

Figure 4:
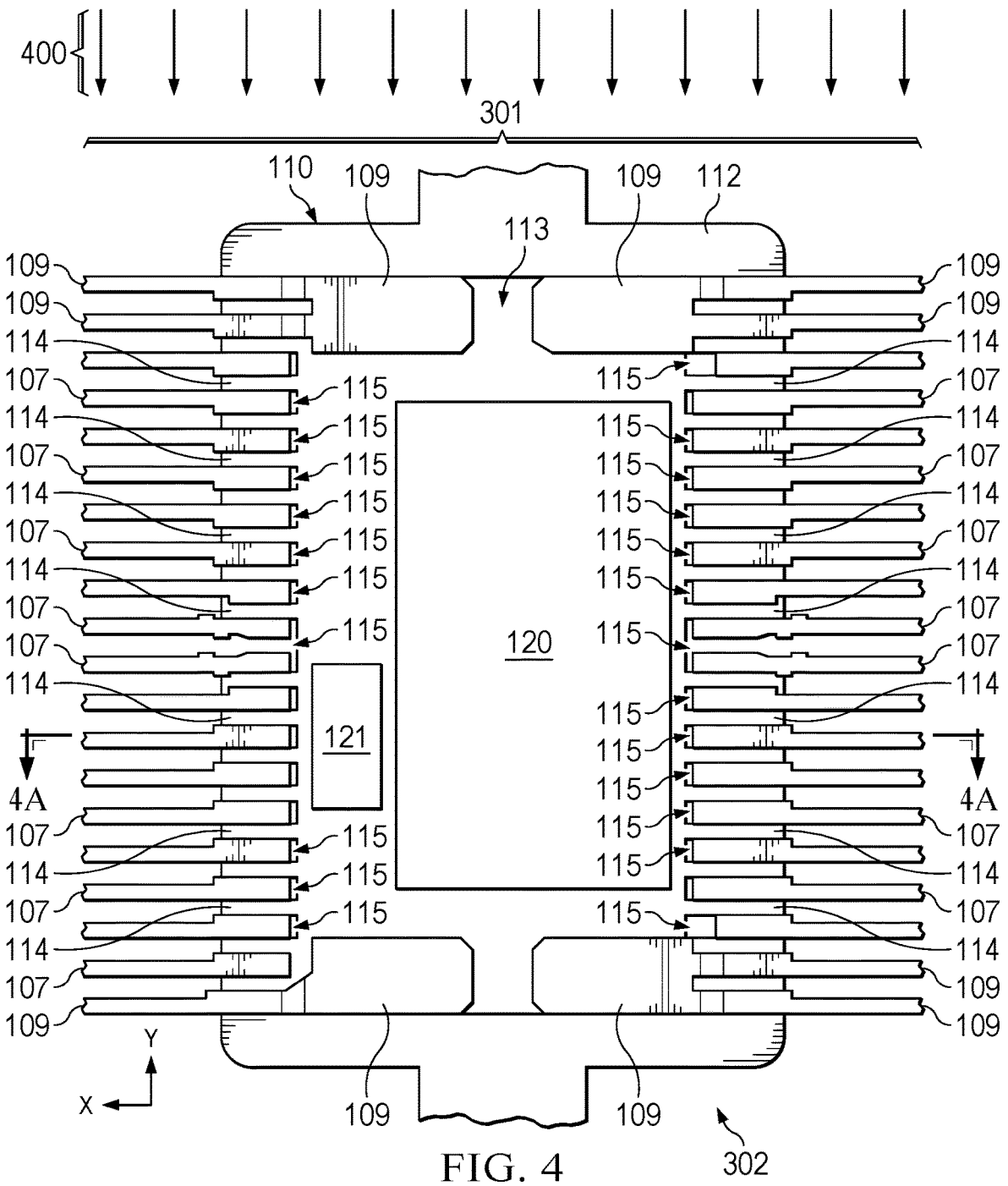
FIGS. 4 and 4A are partial bottom and sectional side elevation views illustrating a die attach process to attach semiconductor dies and/or passive components to the heat slug of a unit area of a lead frame panel array.
Figure 4A:
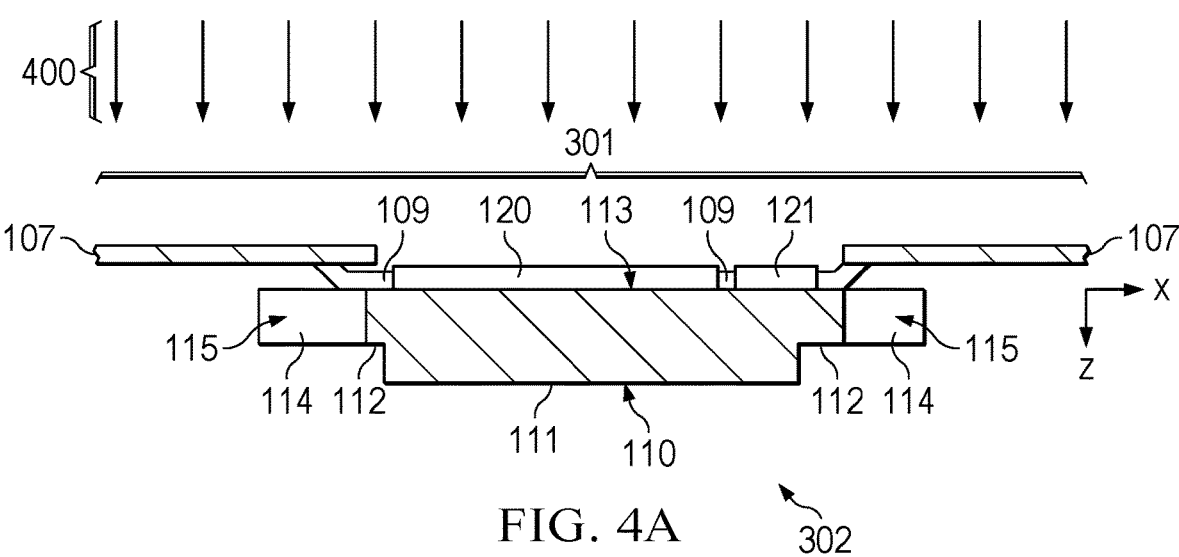

The method 200 continues at 204 in FIG. 2 with attaching one or more dies and/or passive components to the heat slug 110. FIG. 4 shows a bottom view and FIG. 4A shows a side section view taken along line 4A-4A of FIG. 4 of one example, in which a die attach process 400 is performed that attaches the semiconductor dies 120 and 121 to the indented part 113 of the second portion of the heat slug 110 in the illustrated unit area 301 of the of the lead frame panel array 302. Any suitable die or component attachment technique and material can be used. In one example, the die attach process 400 attaches the semiconductor dies 120 and 121 to the second portion of the heat slug 110 using an adhesive (not shown). In one example, the die attach process 400 includes an optional curing step, such as using light (e.g., UV) exposure, thermal curing, etc.

Figure 5:
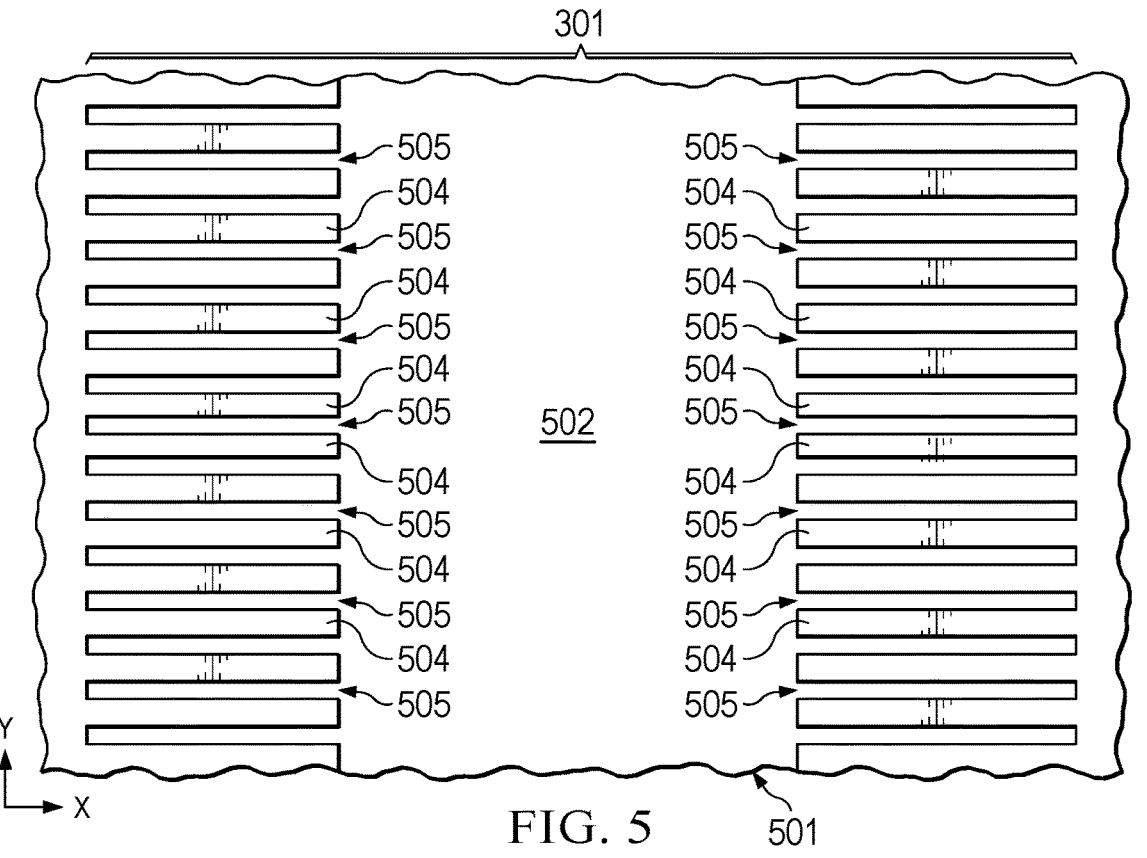
FIG. 5 is a partial top view of a wirebonding tool support block with fins for supporting cantilevered leads of the lead frame panel array during wirebonding.
Figure 5A:
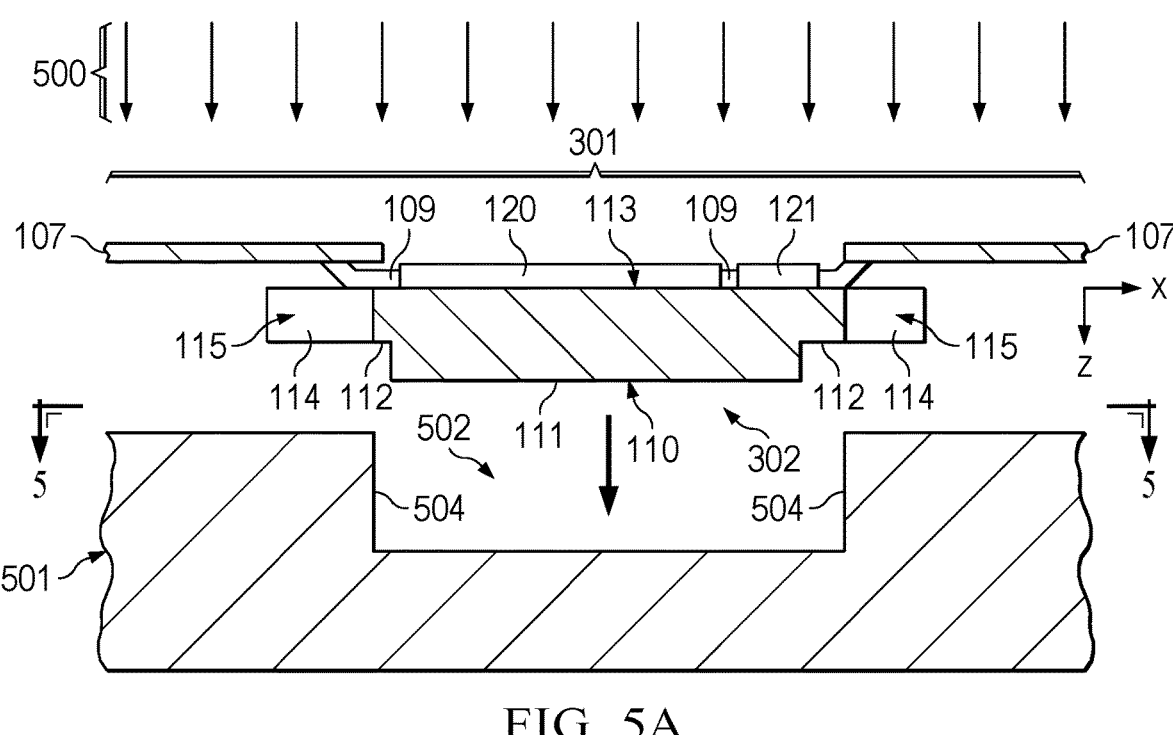
FIGS. 5A and 5B are partial sectional side elevation views illustrating installation of the lead frame panel array into the wirebonding tool support block of FIG. 5.
Figure 5B:
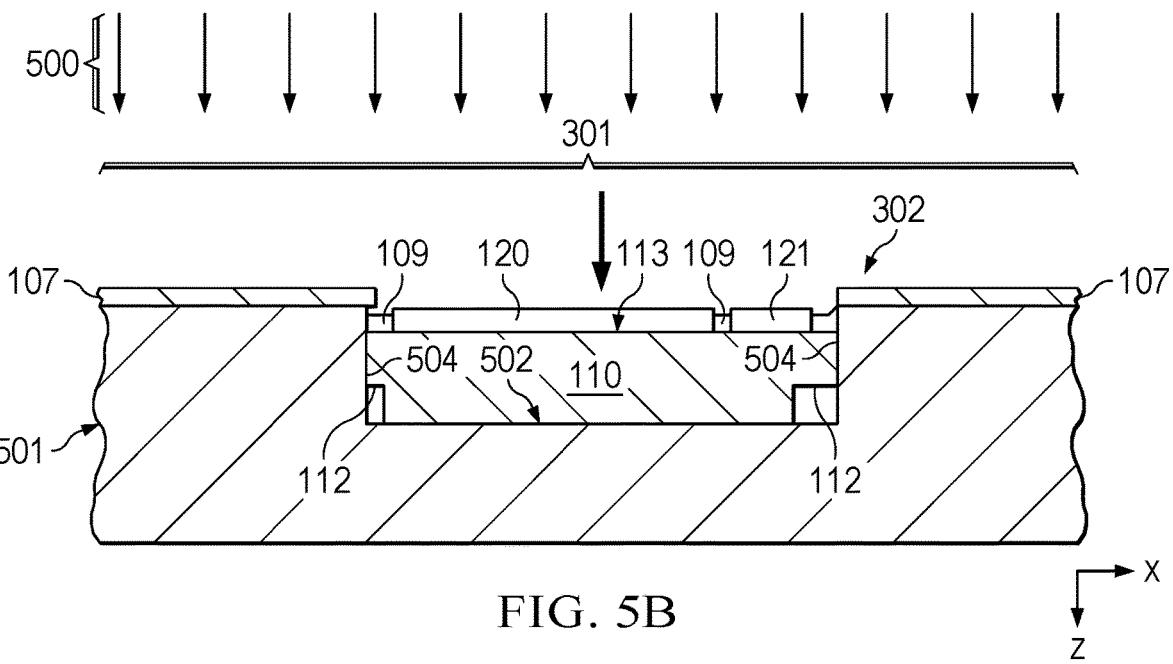

At 206 in FIG. 2, the method 200 includes installing the lead frame panel array 302 in a wirebonding tool with fins of a support block extending through the heat slug slots 115 to engage and structurally support the top sides of the leads 107. FIG. 5 shows a partial top view of an example portion of a support block 501 with a base portion defining a cavity or opening 502 to accommodate the second portion 112 of the heat slug 110, as well as support block fins 504 between respective pairs of support block slots 505 and extending inwardly along the first direction X from both lateral sides of one unit area 301. FIGS. 5A and 5B show partial sectional side views of a portion of the support block 501 in one unit area 301 in one example of a wirebonding tool installation process 500 in which the lead frame panel assembly 302 is installed downward along the direction indicated by the arrows in the support block 501. The placement and installation process 500 positions the lead frame panel assembly 302 and supports the lead frame panel array 302 in the support block 501 as shown in FIG. 5B. The support block fins 504 extend through the slots 115 of the heat slug 110 and engage the bottom sides of the leads 107 of the lead frame panel array 302.

Figure 6:
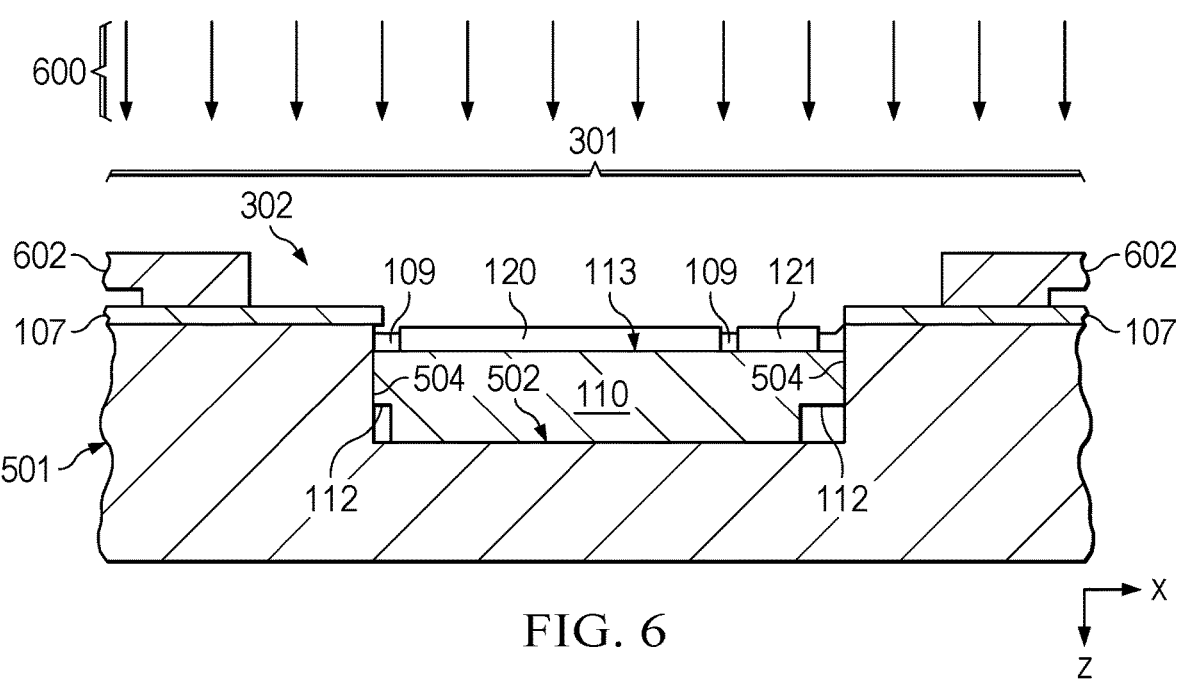
FIG. 6 is a partial sectional side elevation view illustrating mounting of a clamp on the lead frame panel array in the wirebonding tool.

In one implementation, the method 200 includes optional top side clamping at 207 in FIG. 2. FIG. 6 shows one example, in which a clamping process or operation 600 is performed that engages the top sides of the leads 107 of the lead frame panel array 302 with a top side clamp 602. In another implementation, the top side clamping at 207 is omitted.

Figure 7:
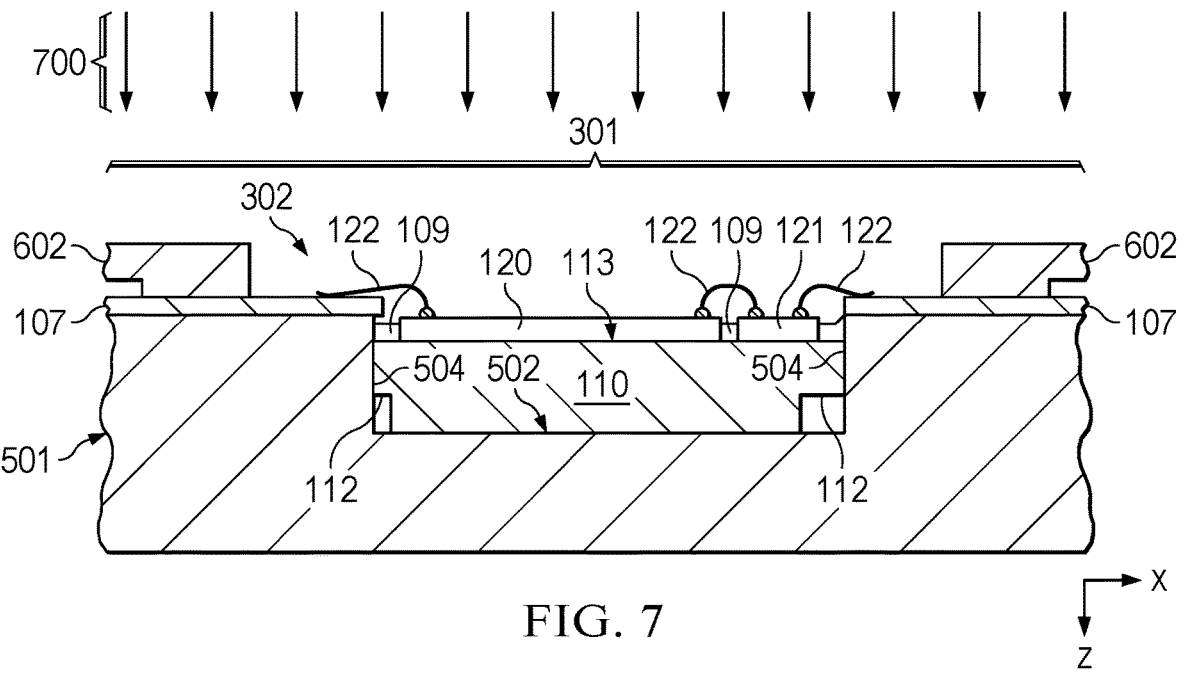
FIG. 7 is a partial sectional side elevation view illustrating the lead frame panel array undergoing a wirebonding process in the wirebonding tool.

At 208 in FIG. 2, the method 200 includes forming one or more bond wires 122. FIG. 7 shows one example, in which a wirebonding process 700 is performed that forms the bond wires 122 to couple circuitry of the dies 120 and 121 to one another and to respective leads 107 of the lead frame panel array 302 in each unit area 301. As previously noted, the bottom side support of the otherwise cantilevered inner first portions of the leads 107 during wirebonding by the support block fins 504 facilitates formation of robust and reliable wire bond connections to provide a solution to mitigate wirebonding failures during operation of the finished electronic devices.

Figure 8:
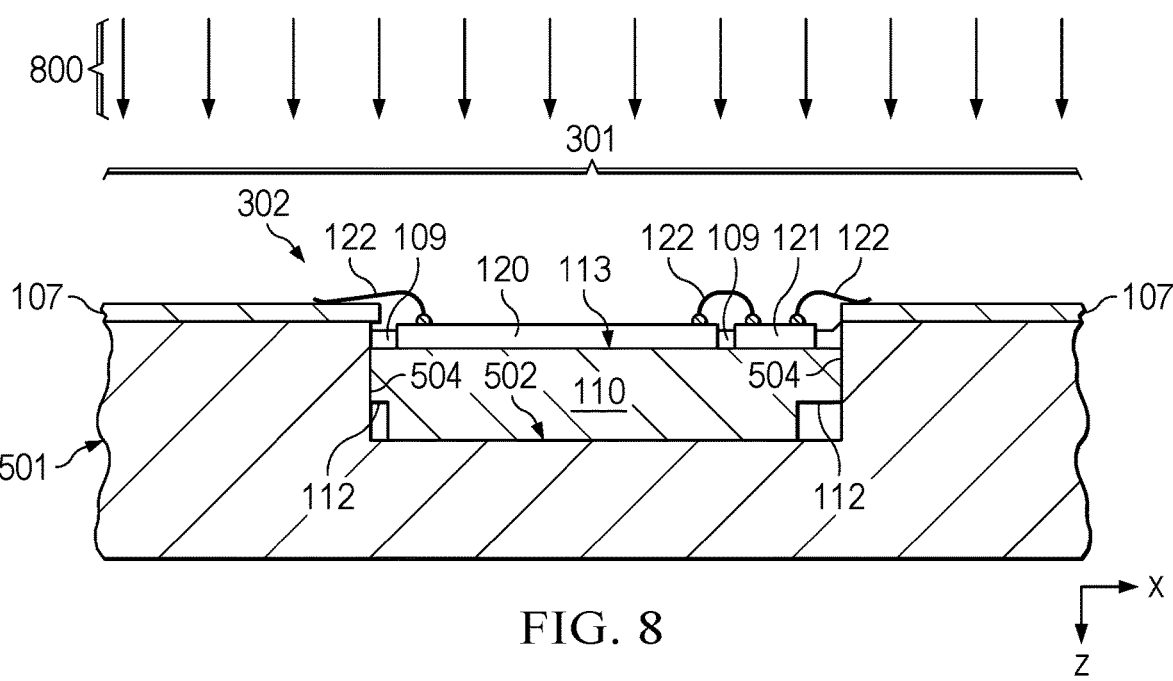
FIG. 8 is a partial sectional side elevation view illustrating removal of the clamp from the lead frame panel array after wirebonding.

In one implementation, the method 200 includes optional clamp retraction at 209 in FIG. 2. FIG. 8 shows one example, in which a retraction or unclamping operation 800 is performed that disengages and retracts the top side clamp 602 from the top sides of the leads 107.

Figure 9:
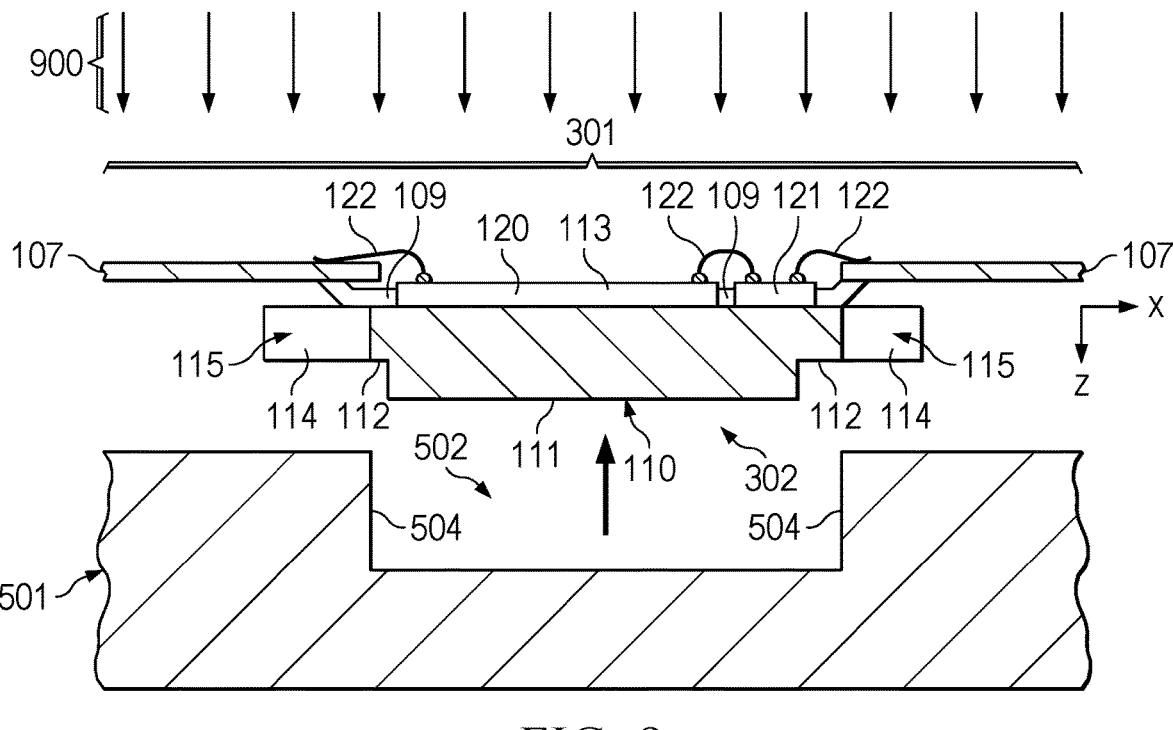
FIG. 9 is a partial sectional side elevation view illustrating removal of the lead frame panel array from the wirebonding tool support block

The method 200 continues with lead frame panel removal at 210 in FIG. 2. FIG. 9 shows one example, in which a removal process 900 is performed that removes the lead frame panel array 302 from the support block 501 of the wirebonding tool along the direction of the indicated arrow.

Figure 10:
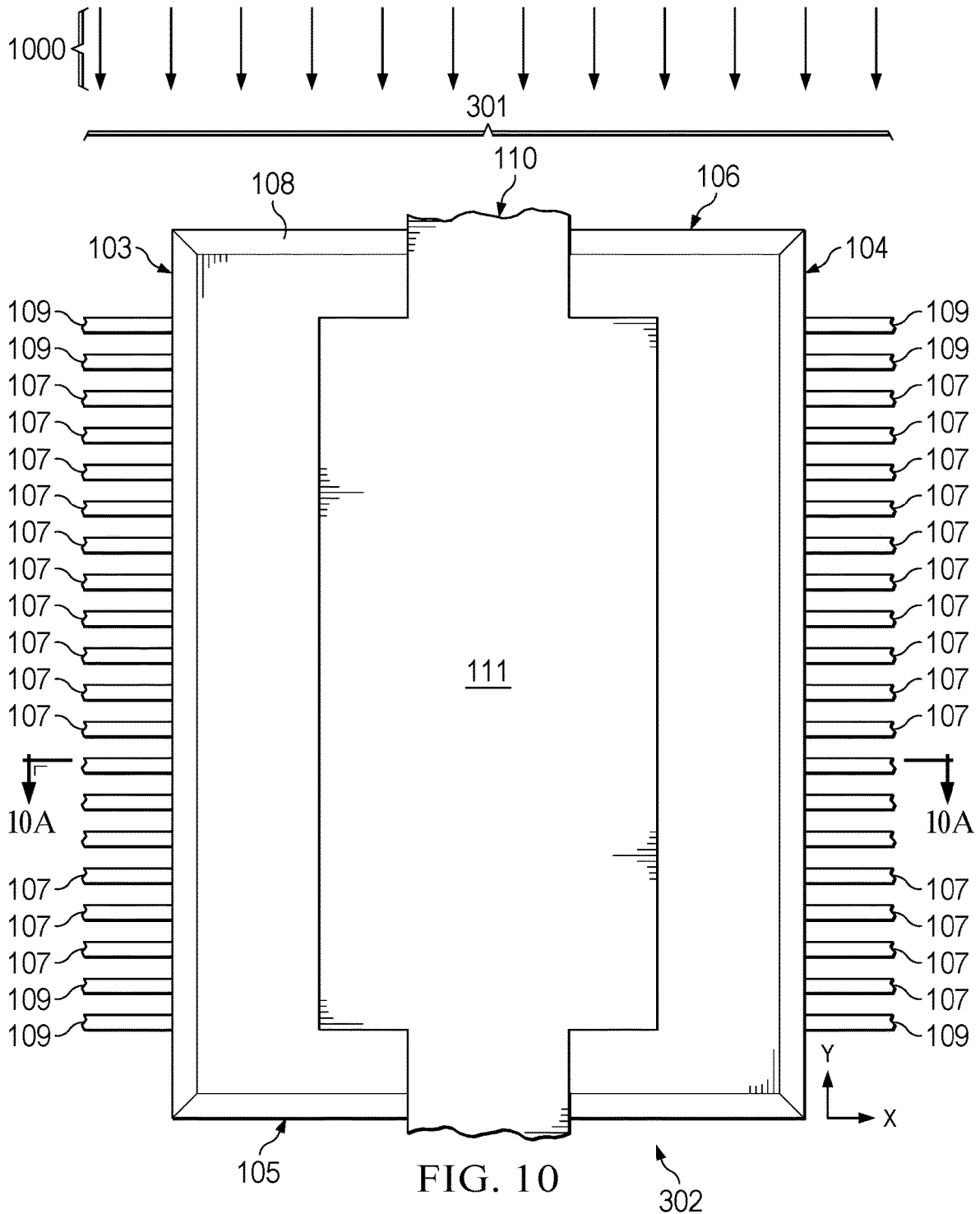
FIG. 10 is a partial top plan view of the lead frame panel array undergoing a molding process.
Figure 10A:
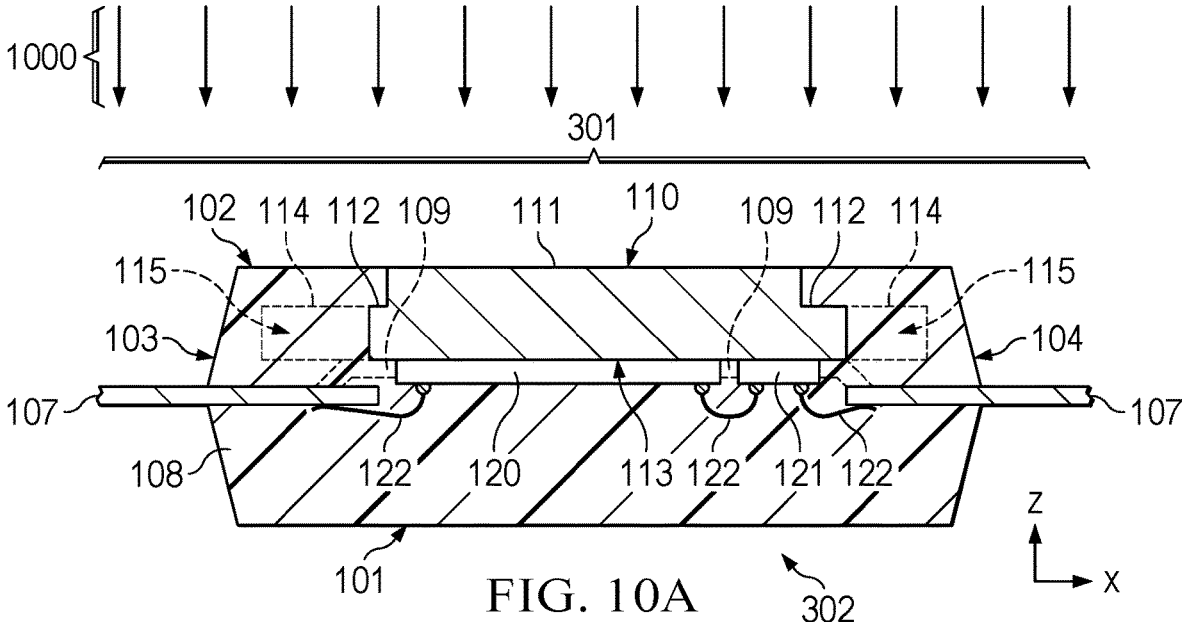
FIG. 10A is a partial sectional side elevation view of the lead frame panel array undergoing the molding process.

At 212 in FIG. 2, the method 200 includes package structure formation, FIG. 10 shows an example top view of a unit area 301 portion of the lead frame panel array 302 undergoing an example molding process 1000 and FIG. 10A shows a partial sectional side view taken along line 10A-10A of FIG. 10. In one example, the molding process 1000 uses a mold with an upper section (not shown) that engages the top side of the first portions of the respective heat slugs 110 and includes shared mold cavities that extend along unit areas 301 along respective columns of the lead frame panel array 302. In another example, the molding process 1000 uses a mold with individual cavities for each respective unit area 301 of the lead frame panel array 302. The molding process 1000 in these examples creates unit or column-length molded package structures 108.

In one example, the method 200 includes lead trim and forming operations at 214 in FIG. 2, for example, to cut along the second direction to separate originally joined lead portions 107 and 109 of adjacent columns in the lead frame panel array 302 using saw cutting, laser cutting or other suitable cutting equipment and techniques. The processing at 214 can also include trimmed lead bending and forming using suitable dies and fixtures (not shown). In the illustrated example, the lead trim and forming at 214 includes bending the trimmed leads into gullwing shapes as shown in FIGS. 1-1B above. In another implementation, the lead trim and forming operations at 214 include bending the trimmed leads partially under the molded package structure 108, for example, to provide J-type leads for the finished devices. In a further example, one or more steps of the lead trim and forming operations at 214 can be omitted.

At 216 in FIG. 2, the method 200 includes package or device separation, including separating finished packaged electronic devices 100 from the beginning lead frame panel array 302.

The novel slots 115 and fins 114 of the heat slug structures 110 (e.g., FIGS. 1D and 1E above) facilitate both heat dissipation during powered operation of the finished electronic device 100 and supported leads during wirebonding to help improve bond wire integrity and device reliability in use. The described examples provide PSOP devices with a small rectangular outline for high power density systems and applications, and the described heat slug 110 can be used in devices having different package types. The described examples provide significant improvement of bond wire reliability by providing structural support and improved stability for the leads 107 during wirebonding operations, and the use of the slots 115 and fins 114 of the heat slug 110 aids in heat dissipation during powered operation of the finished electronic device 100. The improvement of wirebonding yield and reliability by selectively removing heat slug material to form the slots 115 provides improved device performance, and the removal of portions of the heat slug 110 to form the slots 115 and the fins 114 at least partially compensates for the reduced material area by increasing the surface area, thereby mitigating any reduction in heat dissipation.

Modifications are possible in the described examples, and other implementations are possible, within the scope of the claims.

What is claimed is:

1. An electronic device, comprising:
   a package structure having opposite first and second sides, and opposite third and fourth sides that are spaced apart from one another along a first direction;
   a lead having a first portion inside the package structure, and a second portion exposed outside the package structure;
   a heat slug spaced apart from the lead and having first and second portions, the first portion of the heat slug partially exposed outside the second side of the package structure, the second portion of the heat slug including slots extending inwardly along the first direction and fins between respective pairs of the slots, the fins enclosed by the package structure and spaced apart from one another along a second direction that is orthogonal to the first direction;
   a semiconductor die attached to the heat slug; and
   a bond wire inside the package structure and having a first end connected to the first portion of the lead, and a second end connected to a circuit of the semiconductor die.

2. The electronic device of claim 1, wherein:
   the first and second sides are spaced apart from one another along a third direction that is orthogonal to the first and second directions; and
   the lead is aligned with one of the slots along the third direction.

3. The electronic device of claim 1, wherein:
   the first and second sides are spaced apart from one another along a third direction that is orthogonal to the first and second directions;
   the slots and the fins extend along the third direction;
   a first set of the fins are located between respective pairs of a first set of the slots and have respective ends that face the third side of the package structure along the first direction;
   a second set of the fins are located between respective pairs of a second set of the slots and have respective ends that face the fourth side of the package structure along the first direction.

4. The electronic device of claim 3, wherein the electronic device includes:
   a first set of leads, each having a first portion and a second portion, the first portion of each of the first set of leads inside the package structure and aligned with a respective one of the first set of the slots along the third direction, and the second portion of each of the first set of leads extending outward from the third side of the package structure along the first direction; and
   a second set of leads, each having a first portion and a second portion, the first portion of each of the second set of leads inside the package structure and aligned with a respective one of the second set of the slots along the third direction, and the second portion of each of the second set of leads extending outward from the fourth side of the package structure along the first direction.

5. The electronic device of claim 4, further comprising a support lead having a first portion electrically connected to the heat slug inside the package structure, and a second portion exposed outside the package structure.

6. The electronic device of claim 3, further comprising a support lead having a first portion electrically connected to the heat slug inside the package structure, and a second portion exposed outside the package structure.

7. The electronic device of claim 1, further comprising a support lead having a first portion electrically connected to the heat slug inside the package structure, and a second portion exposed outside the package structure.

8. The electronic device of claim 1, wherein the second portion of the heat slug includes fins and slots along two opposite lateral sides thereof.

9. The electronic device of claim 8, wherein the second portion of the heat slug includes an indent.

10. The electronic device of claim 8, wherein the slots and the fins extend along a third direction.

11. The electronic device of claim 1, wherein the slots and the fins extend along a third direction.

12. An electronic device, comprising:
a package structure having opposite first and second sides, and opposite third and fourth sides that are spaced apart from one another along a first direction;
a lead having a first portion inside the package structure, and a second portion exposed outside the package structure;
a heat slug spaced apart from the lead and having first and second portions, the first portion of the heat slug partially exposed outside the second, third and fourth sides of the package structure, the second portion of the heat slug including slots extending inwardly along the first direction and fins between respective pairs of the slots, the fins enclosed by the package structure and spaced apart from one another along a second direction that is orthogonal to the first direction;
a semiconductor die attached to the heat slug; and
a bond wire inside the package structure and having a first end connected to the first portion of the lead, and a second end connected to a circuit of the semiconductor die.

13. The electronic device of claim 12, wherein:
the first and second sides are spaced apart from one another along a third direction that is orthogonal to the first and second directions; and
the lead is aligned with one of the slots along the third direction.

14. The electronic device of claim 12, wherein:
the first and second sides are spaced apart from one another along a third direction that is orthogonal to the first and second directions;
the slots and the fins extend along the third direction;

a first set of the fins are located between respective pairs of a first set of the slots and have respective ends that face the third side of the package structure along the first direction;
a second set of the fins are located between respective pairs of a second set of the slots and have respective ends that face the fourth side of the package structure along the first direction.

15. The electronic device of claim 14, wherein the electronic device includes:
a first set of leads, each having a first portion and a second portion, the first portion of each of the first set of leads inside the package structure and aligned with a respective one of the first set of the slots along the third direction, and the second portion of each of the first set of leads extending outward from the third side of the package structure along the first direction; and
a second set of leads, each having a first portion and a second portion, the first portion of each of the second set of leads inside the package structure and aligned with a respective one of the second set of the slots along the third direction, and the second portion of each of the second set of leads extending outward from the fourth side of the package structure along the first direction.

16. The electronic device of claim 15, further comprising a support lead having a first portion connected to the heat slug inside the package structure, and a second portion exposed outside the package structure.

17. The electronic device of claim 14, further comprising a support lead having a first portion connected to the heat slug inside the package structure, and a second portion exposed outside the package structure.

18. The electronic device of claim 12, further comprising a support lead having a first portion connected to the heat slug inside the package structure, and a second portion exposed outside the package structure.

19. The electronic device of claim 12, wherein the second portion of the heat slug includes fins and slots along two opposite lateral sides thereof.

20. The electronic device of claim 12, wherein the second portion of the heat slug includes an indent.

21. The electronic device of claim 19, wherein the slots and the fins extend along a third direction.

22. The electronic device of claim 12, wherein the slots and the fins extend along a third direction.

* * * * *